(12) United States Patent
Miller

(10) Patent No.: US 6,441,668 B1
(45) Date of Patent: Aug. 27, 2002

(54) DIGITAL DEVICE WITH INTERNAL DIFFERENTIAL SIGNAL GENERATOR

(75) Inventor: James E. Miller, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/286,779

(22) Filed: Apr. 6, 1999

(51) Int. Cl.[7] ............................................. G06F 1/04
(52) U.S. Cl. ...................... 327/298; 327/403; 327/407; 327/99; 365/233
(58) Field of Search ................................. 327/291, 293, 327/294, 298, 201, 213, 215, 365, 373, 403, 407, 99; 365/233, 230.02, 230.06

(56) References Cited

U.S. PATENT DOCUMENTS

| | | | | |
|---|---|---|---|---|
| 5,818,894 A | * | 10/1998 | Song | 377/69 |
| 6,018,260 A | * | 1/2000 | Gabara | 327/201 |
| 6,011,751 A | * | 2/2000 | Hirabayashi | 365/236 |

* cited by examiner

*Primary Examiner*—Timothy P. Callahan
*Assistant Examiner*—Minh Nguyen
(74) *Attorney, Agent, or Firm*—Williams, Morgan & Amerson, P.C.

(57) ABSTRACT

A device includes a first input pin, a second input pin, a differential signal generator, and a differential receiver. The first input pin is adapted to receive a first signal. The second input pin is adapted to receive a second signal. The differential signal generator is coupled to the first and second input pins and adapted to receive an enable signal. The differential signal generator is adapted to isolate the second input pin and generate an internal signal based on an inversion of the first signal in response to the enable signal being asserted. The differential receiver has a first input terminal and a second input terminal. The differential receiver is adapted to receive the first signal at the first input terminal and one of the second signal and the internal signal at the second input terminal and generate a differential output signal. A method for generating a differential signal is provided. A first input signal is received at a first input pin of a device. An enable signal is received. A second input pin of the device is isolated based on the enable signal. An internal signal is generated based on an inversion of the first signal. The differential signal is generated based on the first signal and the internal signal.

31 Claims, 4 Drawing Sheets

DIGITAL DEVICE WITH INTERNAL DIFFERENTIAL SIGNAL GENERATOR

BACKGROUND OF THE INVENTION

1. Field of the Invention

This invention relates generally to digital devices, and more particularly, to a digital device having an internal differential signal generator.

2. Description of the Related Art

The operating speeds of digital devices continues to increase, driven by expectations of continual performance gain. One technique for increasing the performance of a digital device involves the use of differential signaling to send and receive data at higher speeds. Digital devices, such as memory devices, often use differential signaling to generate differential clock signals for use by the device.

A differential clock signal is generated by passing an external clock signal (CLK) and an external inverted clock signal ($\overline{CLK}$) to a differential receiver. The differential receiver outputs a logic high level when the CLK signal is greater than the $\overline{CLK}$ signal and a logic low level when the CLK signal is lesser an the $\overline{CLK}$ signal. The fact that both the CLK signal and the $\overline{CLK}$ signal are transitioning at the same time provides a cleaner transition for generating the differential clock signal.

FIG. 4 is a timing diagram illustrating the relationship between the CLK signal, the $\overline{CLK}$ signal, and an exemplary output clock signal of the digital receiver, DCLK. The DCLK signal may be a single signal (as shown) or a differential signal having complimentary components.

Typically, digital devices are tested by a low speed testing system to determine their proper function. A single test unit may test a large number of devices simultaneously. During the test, the test unit supplies the logic signals required to operate the device. Devices that use differential signaling have external pins for receiving the CLK signal and the $\overline{CLK}$ signal. Many low speed test systems have limited pin resources, yet the devices being tested have increasing pin counts due to the use of differential signaling. As a result, it becomes more difficult to supply the number of logic signals required to test a large number of devices in parallel.

One technique for reducing the pin resource demand on the test unit is to couple one of the differential signal input pins on the device to a reference voltage (e.g. half of the operating voltage, Vcc). Thus, the differential receiver transitions when the other signal of the differential pair passes through the reference voltage. In this configuration, the test unit is only required to provide one half of the differential pair, thus reducing the pin resource demands on the test unit.

The technique of tying one of the differential inputs to a reference voltage has at least one shortcoming in that high speed differential receivers work best when both of the inputs are changing concurrently. When only one signal of the differential pair is changing, the stability and effectiveness of the differential receivers are reduced. This deleteriously affects the ability of the test unit to test multiple devices in parallel.

The present invention is directed to overcoming, or at least reducing the effects of, one or more of the problems set forth above.

SUMMARY OF THE INVENTION

One aspect of the present invention is seen in a device including a first input pin, a second input pin, a differential signal generator, and a differential receiver. The first input pin is adapted to receive a first signal. The second input pin is adapted to receive a second signal. The differential signal generator is coupled to the first and second input pins and adapted to receive an enable signal. The differential signal generator is adapted to isolate the second input pin and generate an internal signal based on an inversion of the first signal in response to the enable signal being asserted. The differential receiver has a first input terminal and a second input terminal. The differential receiver is adapted to receive the first signal at the first input terminal and one of the second signal and the internal signal at the second input terminal and generate a differential output signal.

Another aspect of the present invention is seen in a method for generating a differential signal. A first input signal is received at a first input pin of a device. An enable signal is received. A second input pin of the device is isolated based on the enable signal. An internal signal is generated based on an inversion of the first signal. The differential signal is generated based on the first signal and the internal signal.

BRIEF DESCRIPTION OF THE DRAWINGS

The invention may be best understood by reference to the following description taken in conjunction with the accompanying drawings, in which like reference numerals identify like elements, and in which.

Figure 1:
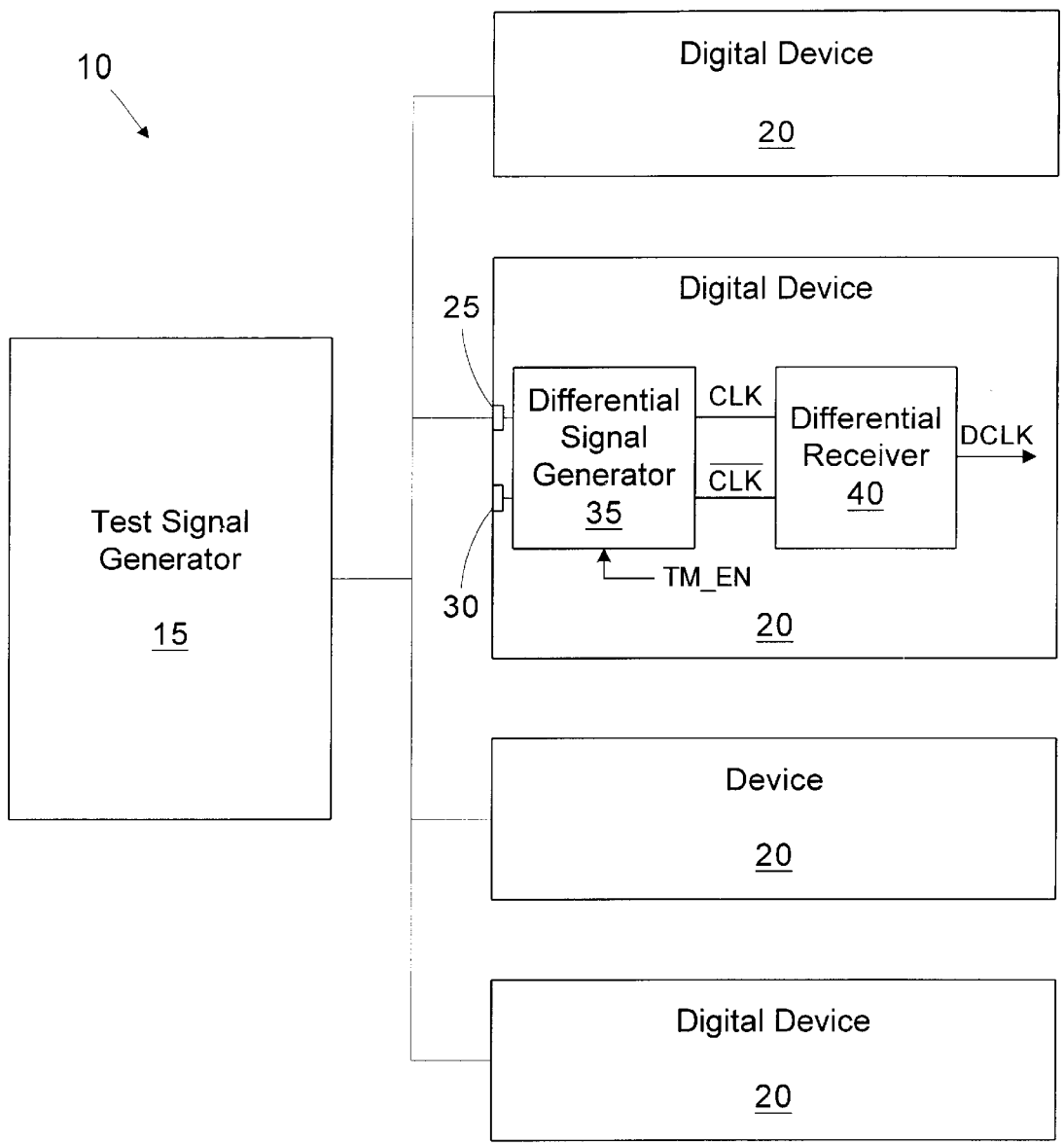
FIG. 1 is a simplified block diagram of a testing system in accordance with the present invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Referring to FIG. 1, a simplified block diagram of a testing system 10 in accordance with the present invention is provided. The testing system 10 includes a test signal generator 15 coupled to a plurality of digital devices 20. The test signal generator 15 provides logic signals for controlling the digital devices 20 during testing evolutions. The test signal generator 15 may have many individual lines (e.g., address, data, control) coupled to each of the digital devices 20, however, for clarity and ease of illustration, only those lines necessary for understanding the present invention are described in detail herein. A number of commercially available test signal generators 15 are know to those of ordinary skill in the art for providing the logic signals to the digital devices 20. An exemplary test signal generator 15 is a Teradyne J994 model.

In the illustrated embodiment, the digital devices 20 require a differential signal input. For purposes of illustration, the differential signal input is a differential clock input. Each digital device 20 includes input pins 25, 30 for receiving a clock signal (CLK) and an inverted clock signal ($\overline{CLK}$), respectively. To reduce the number of logic signals provided by the test signal generator 15, the input pin 30 associated with $\overline{CLK}$ signal is not connected to the test signal generator 15. The test signal generator 15 does, however, provide the CLK signal to the input pin 25. The input pins 25, 30 are coupled to a differential signal generator 35.

When the digital device 20 is operating in a low speed mode (i.e., for testing or programming), a test mode enable signal (TM_EN) is generated. The test mode enable signal may be generated internally based on mode information stored in the digital device 20, or alternatively, the test mode enable signal may be provided through an additional input pin (not shown). In response to the test mode enable signal being asserted (i.e., at a logic high level in the illustrated embodiment), the differential signal generator 35 isolates the input pin 30 associated with the $\overline{CLK}$ signal and generates an internal $\overline{CLK}$ signal. The differential signal generator 35 is coupled to a differential receiver 40 that generates a differential clock signal (DCLK) based on the CLK and $\overline{CLK}$ signals.

Figure 2:
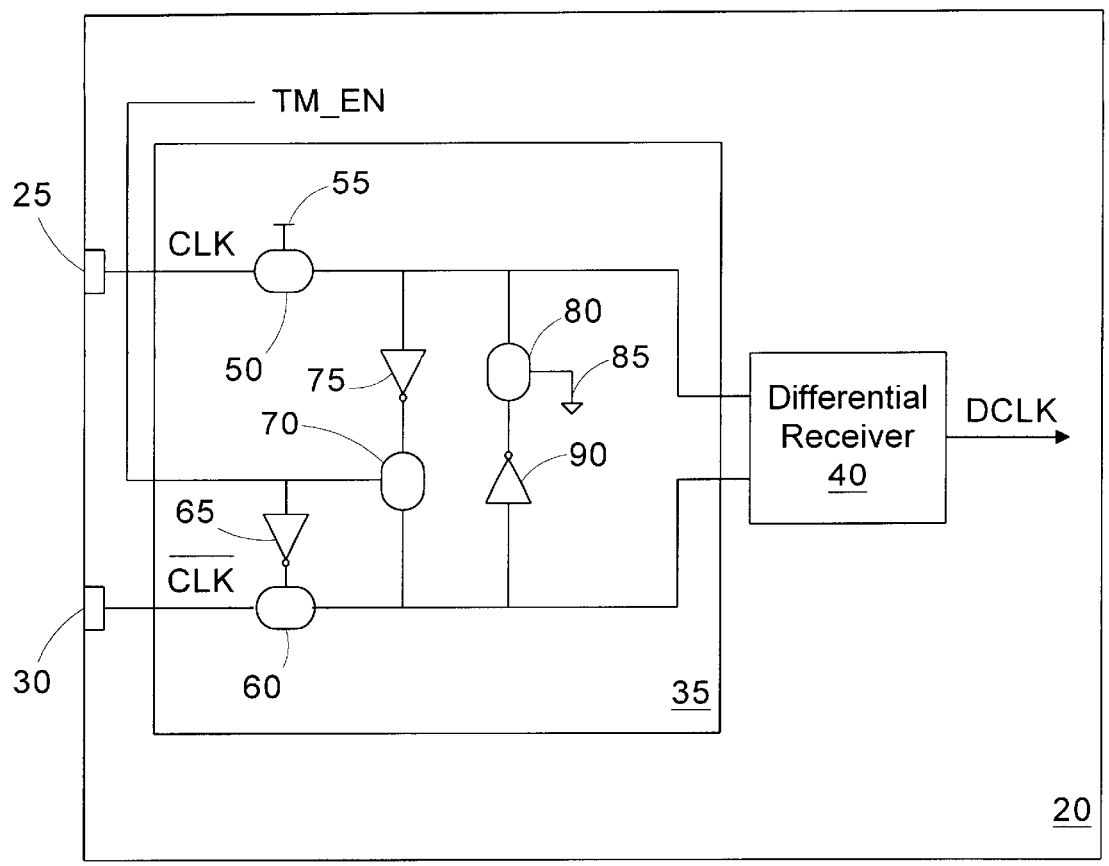
FIG. 2 is a simplified block diagram of a digital device including a differential signal generator tested in the testing system of FIG. 1.

Turning now to FIG. 2, a simplified block diagram of the digital device 20, including a more detailed view of the differential signal generator 35, is provided. During normal, high speed operation (i.e., not under test), the differential signal generator 35 is coupled to the input pins 25, 30 for receiving the externally supplied CLK and $\overline{CLK}$ signals.

The input pin 25 is coupled to a pass gate 50. The enable input of the pass gate 50 is coupled to a voltage source 55 (i.e., Vcc), and as such, the pass gate 50 is always enabled. The input pin 30 is coupled to a pass gate 60. The enable input of the pass gate 60 is coupled to an inverter 65. The inverter 65 is coupled to receive the test mode enable signal (TM_EN). During normal. high speed operation, the test mode enable signal is deasserted, and thus, the pass gate 60 is enabled. The pass gates 50, 60 are coupled to the inputs of the differential receiver 40 for passing the externally supplied CLK and $\overline{CLK}$ signals.

When the digital device 20 is operating in a low speed, test mode, as designated by the assertion of the test mode enable signal (TM_EN), the inverter 65 provides a logic low output, thus disabling the pass gate 60 and isolating the input pin 30 associated with the $\overline{CLK}$ signal from the differential receiver 40. The test mode enable signal (TM_EN) also enables a pass gate 70. The pass gate 70 is coupled to the output of the pass gate 50 through an inverter 75. Thus, when the test mode enable signal is asserted, the differential receiver 40 receives an inverted version of the CLK signal. Because the digital device 20 is operating in a low speed mode, the delay between the CLK signal and the inverted CLK signal caused by the inverter 70 and the pass gate 75 does not significantly affect the operation of the differential receiver 40.

The differential signal generator 35 also includes a pass gate 80 coupled to the output of the pass gate 50. The pass gate 80 is tied to a ground voltage source 85 to cause it to be always disabled. An inverter 90 is coupled between the pass gate 80 and the output of the pass gate 60. The function of the pass gates 50, 80, and the inverter 90 is to provide a matched load on the paths between the input pins 25, 30 and the differential receiver 40 when the digital device 20 is operating in its normal mode. The CLK signal supplied through the input pin 25 passes through the pass gate 50 and is exposed to the load from the inverter 75 and the disabled pass gate 80. Likewise, $\overline{CLK}$ signal supplied through the input pin 30 passes through the pass gate 60 and is exposed to the load from the inverter 90 and the disabled pass gate 70. The matched loading conditions help avoid the creation of a phase difference between the CLK and $\overline{CLK}$ signals at the differential receiver 40.

By isolating the input pin 30 and internally generating the $\overline{CLK}$ signal, the differential signal generator 35 provides a more reliable input for the differential receiver 40, while at the same time, reducing the pin count demands on the test signal generator 15. This serves to increase the efficiency of the testing system 10 by allowing higher numbers of digital devices 20 to be tested in parallel.

Figure 3:
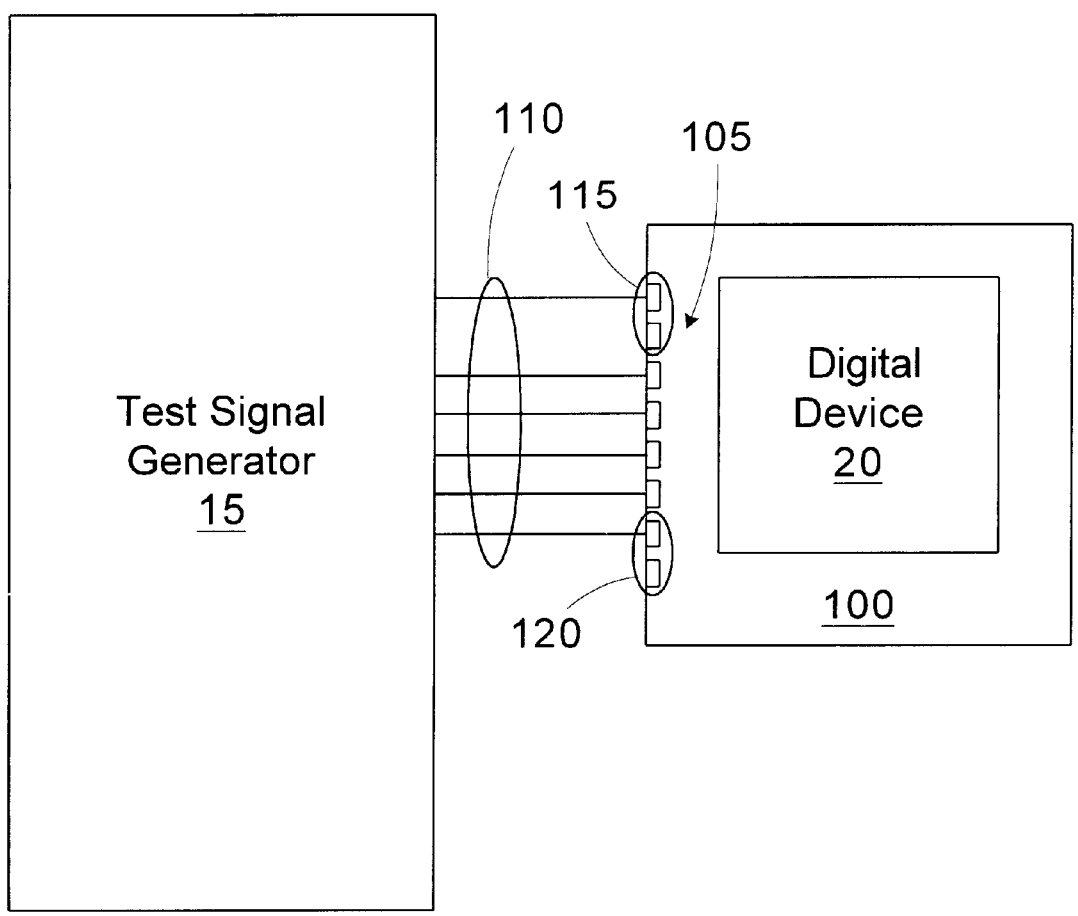
FIG. 3 is a simplified block diagram illustrating the interconnections between the test signal generator and one of the digital devices of FIG. 1.
Figure 4:
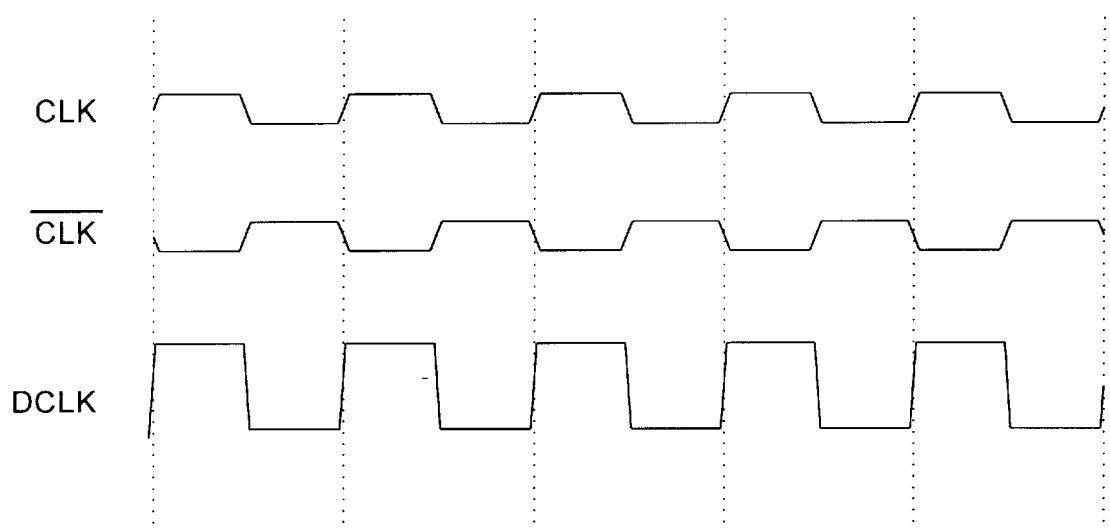
FIG. 4 is a timing diagram illustrating the relationship between the input and output signals of an exemplary differential receiver.

Turning now to FIG. 3, a simplified block diagram illustrating the interconnections between the test signal generator 15 and one of the digital devices 20 is provided. The digital device 20 is mounted in a socket 100. The layout of the socket 100 corresponds to the specific layout of the digital device 20. The socket 100 includes a plurality of socket pins 105 coupled to test lines 110 of the signal generator for communicating logic signals. Socket pin pairs 115, 120 correspond to differential signal inputs (not shown) on the digital device 20. The test signal generator 15 provides the test mode enable signal on one of the test lines 110. In response to the test mode enable signal, the digital device 20 isolates one of its input pins (not shown) corresponding to one of the socket pins 105 of the socket pin pairs 115, 120 and generates an internal differential signal as described above. As a result, one test line 110 for each of the socket pin pairs 115, 120 is freed for use with a different digital device 20. This savings is multiplied by the number of like digital devices 20 being tested, thus increasing the capacity of the test signal generator 15.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A device, comprising:
   a first input pin adapted to receive a first differential component of a signal;
   a second input pin adapted to receive a second differential component of the signal;
   a differential signal generator coupled to the first and second input pins and adapted to receive an enable signal, wherein the differential signal generator includes logic adapted to isolate the second input pin and generate an internal differential signal component based on an inversion of the first differential component of the signal in response to the enable signal being asserted; and a differential receiver having a first input terminal and a second input terminal and being adapted to receive the first differential component of the signal at the first input terminal and one of the second differential component of the signal and the internal differential signal component at the second input terminal and generate an output signal having a high logic level responsive to a voltage at the first input terminal being greater than a voltage at the second input terminal and a low logic level responsive to the voltage at the first input terminal being less than the voltage at the second input terminal.

2. The device of claim 1, wherein the differential signal generator includes a pass gate coupled to the second input pin, the pass gate having a first enable input coupled to receive the enable signal.

3. The device of claim 2, wherein the differential signal generator includes an inverter coupled to the first enable input and adapted to receive the enable signal.

4. The device of claim 1, wherein the differential signal generator includes an inverter coupled between the first input pin and the second input terminal of the differential receiver, the internal differential signal component comprising the output of the inverter.

5. The device of claim 4, wherein the differential signal generator includes a pass gate coupled between the inverter and the second input terminal of the differential receiver, the pass gate having an enable input coupled to receive the enable signal.

6. The device of claim 1, wherein the differential signal generator comprises:

a first inverter coupled to the first input pin, the internal differential signal component comprising the output of the first inverter;

a first pass gate coupled to the first inverter and the second input terminal of the differential receiver, the first pass gate having a first enable input coupled 4 to receive the enable signal and being adapted to pass the internal differential signal component to the second input terminal in response to the enable signal being asserted; and a second pass gate coupled to the second input pin and the second input terminal of the differential receiver, the second pass gate having a second enable input coupled to receive the enable signal and being adapted to isolate the second input pin from the second input terminal in response to the enable signal being deasserted.

7. The device of claim 6, wherein the differential signal generator further comprises:

a third pass gate coupled between the first input pin and the first input terminal of the differential receiver, the third pass gate having a third enable input coupled to a voltage source;

a fourth pass gate coupled to the first input pin, the fourth pass gate having a fourth enable input coupled to ground; and a second inverter coupled between the second input terminal of the differential receiver and the fourth pass gate.

8. The device of claim 1, wherein the first differential component of the signal comprises a clock signal.

9. A device, comprising:

a first input pin adapted to receive a first signal;

a second input pin adapted to receive a second signal;

a differential receiver having a first input terminal and a second input terminal; and a differential signal generator coupled to the first and second input pins and adapted to receive an enable signal, wherein the differential signal generator is adapted to isolate the second input pin and generate an internal signal based on an inversion of the first signal in response to the enable signal being asserted, the differential signal generator comprising:

a first inverter coupled to the first input pin, the internal signal comprising the output of the first inverter;

a first pass gate coupled to the first inverter and the second input terminal of the differential receiver, the first pass gate having a first enable input coupled to receive the enable signal and being adapted to pass the internal signal to the second input terminal in response to the enable signal being asserted;

a second pass gate coupled to the second input pin and the second input terminal of the differential receiver, the second pass gate having a second enable input coupled to receive the enable signal and being adapted to isolate the second input pin from the second input terminal in response to the enable signal being deasserted;

a third pass gate coupled between the first input pin and the first input terminal of the differential receiver, the third pass gate having a third enable input coupled to a voltage source;

a fourth pass gate coupled to the first input pin, the fourth pass gate having a fourth enable input coupled to ground; and a second inverter coupled between the second input terminal of the differential receiver and the fourth pass gate, wherein the differential receiver is further adapted to receive the first signal at the first input terminal and one of the second signal and the internal signal at the second input terminal and generate an output signal having a high logic level responsive to a voltage at the first input terminal being greater than a voltage at the second input terminal and a low logic level responsive to the voltage at the first input terminal being less than the voltage at the second input terminal.

10. A system, comprising:

a signal generator adapted to provide at least a first differential component of a signal;

a device coupled to the signal generator, the device comprising:

a first input pin adapted to receive the first differential component of the signal;

a second input pin;

a differential signal generator coupled to the first and second input pins and adapted to receive an enable signal, wherein the differential signal generator includes logic adapted to isolate the second input pin and generate an internal differential signal component based on an inversion of the first differential component of the signal in response to the enable signal being asserted; and a differential receiver having a first input terminal and a second input terminal and being adapted to receive the first differential component of the signal at the first input terminal and the internal differential signal component at the second input terminal and generate a differential output signal.

11. The system of claim 10, wherein the differential signal generator includes a pass gate coupled to the second input pin, the pass gate having a first enable input coupled to receive the enable signal.

12. The system of claim 11, wherein the differential signal generator includes an inverter coupled to the first enable input and adapted to receive the enable signal.

13. The system of claim 10, wherein the differential signal generator includes an inverter coupled between the first input pin and the second input terminal of the differential receiver, the internal differential signal component comprising the output of the inverter.

14. The system of claim 13, wherein the differential signal generator includes a pass gate coupled between the inverter and the second input terminal of the differential receiver, the pass gate having an enable input coupled to receive the enable signal.

15. The system of claim 10, wherein the differential signal generator comprises:
   a first inverter coupled to the first input pin, the internal differential signal component comprising the output of the first inverter;
   a first pass gate coupled to the first inverter and the second input terminal of the differential receiver, the first pass gate having a first enable input coupled to receive the enable signal and being adapted to pass the internal differential signal component to the second input terminal in response to the enable signal being asserted; and
   a second pass gate coupled to the second input pin and the second input terminal of the differential receiver, the second pass gate having a second enable input coupled to receive the enable signal and being adapted to isolate the second input pin from the second input terminal in response to the enable signal being deasserted.

16. The system of claim 15, wherein the differential signal generator further comprises:
   a third pass gate coupled between the first input pin and the first input terminal of the differential receiver, the third pass gate having a third enable input coupled to a voltage source;
   a fourth pass gate coupled to the first input pin, the fourth pass gate having a fourth enable input coupled to ground; and
   a second inverter coupled between the second input terminal of the differential receiver and the fourth pass gate.

17. The system of claim 10, wherein the first signal comprises a clock signal.

18. A system, comprising:
   a signal generator adapted to provide at least a first signal;
   a device coupled to the signal generator, the device comprising:
      a first input pin adapted to receive the first signal;
      a second input pin;
      a differential receiver having a first input terminal and a second input terminal; and
      a differential signal generator coupled to the first and second input pins and adapted to receive an enable signal, wherein the differential signal generator is adapted to isolate the second input pin and generate an internal signal based on an inversion of the first signal in response to the enable signal being asserted, the differential signal generator comprising:
         a first inverter coupled to the first input pin, the internal signal comprising the output of the first inverter;
         a first pass gate coupled to the first inverter and the second input terminal of the differential receiver, the first pass gate having a first enable input coupled to receive the enable signal and being adapted to pass the internal signal to the second input terminal in response to the enable signal being asserted; and
         a second pass gate coupled to the second input pin and the second input terminal of the differential receiver, the second pass gate having a second enable input coupled to receive the enable signal and being adapted to isolate the second input pin from the second input terminal in response to the enable signal being deasserted;
         a third pass gate coupled between the first input pin and the first input terminal of the differential receiver, the third pass gate having a third enable input coupled to a voltage source;
         a fourth pass gate coupled to the first input pin, the fourth pass gate having a fourth enable input coupled to ground; and
         a second inverter coupled between the second input terminal of the differential receiver and the fourth pass gate;
   wherein the differential receiver is further adapted to receive the first signal at the first input terminal and the internal signal at the second input terminal and generate a differential output signal.

19. A method for generating an output signal, comprising:
receiving a first differential component of an input signal at a first input pin of a device;
receiving an enable signal;
isolating a second input pin of the device based on the enable signal;
generating an internal differential signal component based on an inversion of the first differential component of the input signal; and
generating the output signal based on the first differential component of the input signal and the internal differential signal component, the output signal having a high logic level responsive to the first differential component of the input signal having a voltage greater than the internal differential signal component and a low logic level to responsive to the first differential component of the input signal having a voltage less than the internal differential signal component.

20. A device, comprising:
means for receiving a first differential component of an input signal;
means for receiving a second differential component of the input signal;
means for receiving an enable signal;
means for isolating the second input signal based on the enable signal;
means for generating an internal differential signal component based on an inversion of the first differential component of the input signal; and
means for generating an output signal based on the differential component of the input signal and the internal differential signal component, the output signal having a high logic level responsive to the first differential component of the input signal having a voltage greater than the internal differential signal component and a low logic level to responsive to the first differential component of the input signal having a voltage less than the internal differential signal component.

21. A method for testing a digital device having first and second input pins for receiving a differential signal, comprising:

receiving a first differential component of an input signal at the first input pin;

receiving an enable signal;

isolating the second input pin of the device based on the enable signal;

generating an internal differential signal component based on an inversion of the first differential component of the input signal;

generating an internal differential signal based on the first differential component of the input signal and the internal differential signal component;

testing the operability of the digital device using the internal differential signal.

22. A testing system, comprising:

a signal generator adapted to provide a plurality of test signals including at least a first differential component of a signal;

a device coupled to the signal generator, the device comprising:

a plurality of external pins, at least a subset of the external pins being coupled to the signal generator to receive at least a subset of the test signals, the plurality of external pins including:

a first input pin adapted to receive the first differential component of the signal; and a second input pin;

a differential signal generator coupled to the first and second input pins and adapted to receive an enable signal, wherein the differential signal generator includes logic adapted to isolate the second input pin and generate an internal differential signal component based on an inversion of the first differential component of the signal in response to the enable signal being asserted; and a differential receiver having a first input terminal and a second input terminal and being adapted to receive the first differential component of the signal at the first input terminal and the internal differential signal component at the second input terminal mid generate an output signal having a high logic level responsive to a voltage at the first input terminal being greater than a voltage at the second input terminal and a low logic level responsive to the voltage at the first input terminal being less than the voltage at the second input terminal.

23. The testing system of claim 22, wherein the differential signal generator includes a pass gate coupled to the second input pin, the pass gate having a first enable input coupled to receive the enable signal.

24. The testing system of claim 23, wherein the differential signal generator includes an inverter coupled to the first enable input and adapted to receive the enable signal.

25. The testing system of claim 22, wherein the differential signal generator includes an inverter coupled between the first input pin and the second input terminal of the differential receiver, the internal differential signal component comprising the output of the inverter.

26. The testing system of claim 25, wherein the differential signal generator includes a pass gate coupled between the inverter and the second input terminal of the differential receiver, the pass gate having an enable input coupled to receive the enable signal.

27. The testing system of claim 22, wherein the differential signal generator comprises:

a first inverter coupled to the first input pin, the internal differential signal component comprising the output of the first inverter;

a first pass gate coupled to the first inverter and the second input terminal of the differential receiver, the first pass gate having a first enable input coupled to receive the enable signal and being adapted to pass the internal differential signal component to the second input terminal in response to the enable signal being asserted; and a second pass gate coupled to the second input pin and the second input terminal of the differential receiver, the second pass gate having a second enable input coupled to receive the enable signal and being adapted to isolate the second input pin from the second input terminal in response to the enable signal being deasserted.

28. The testing system of claim 27, wherein the differential signal generator further comprises:

a third pass gate coupled between the first input pin and the first input terminal of the differential receiver, the third pass gate having a third enable input coupled to a voltage source;

a fourth pass gate coupled to the first input pin, the fourth pass gate having a fourth enable input coupled to ground; and a second inverter coupled between the second input terminal of the differential receiver and the fourth pass gate.

29. The testing system of claim 22, wherein the first signal comprises a clock signal.

30. The testing system of claim 22, wherein the signal generator is not coupled to the second input pin.

31. A testing system, comprising:

a signal generator adapted to provide a plurality of test signals including at least a first signal;

a device coupled to the signal generator, the device comprising:

a plurality of external pins, at least a subset of the external pins being coupled to the signal generator to receive at least a subset of the test signals, the plurality of external pins including:

a first input pin adapted to receive the first signal; and a second input pin;

a differential receiver having a first input terminal and a second input terminal; and a differential signal generator coupled to the first and second input pins and adapted to receive all enable signal, wherein the differential signal generator is adapted to isolate the second input pin and generate an internal signal based on an inversion of the first signal in response to the enable signal being asserted, the differential signal generator comprising:

a first inverter coupled to the first input pin, the internal signal comprising the output of the first inverter;

a first pass gate coupled to the first inverter and the second input terminal of the differential receiver, the first pass gate having a first enable input coupled to receive the enable signal and being adapted to pass the internal signal to the second input terminal in response to the enable signal being asserted; and a second pass gate coupled to the second input pin and the second input terminal of the differential receiver, the second pass gate having a second enable input coupled to receive the enable signal and being adapted to isolate the second input pin from the second input terminal in response to the enable signal being deasserted
  a third pass gate coupled between the first input pin and the first input terminal of the differential receiver, the third pass gate having a third enable input coupled to a voltage source;
  a fourth pass gate coupled to the first input pin, the fourth pass gate having a fourth enable input coupled to ground; and
  a second inverter coupled between the second input terminal of the differential receiver and the fourth pass gate, wherein the differential receiver is further adapted to receive the first signal at the first input terminal and the internal signal at the second input terminal and generate an output signal having a high logic level responsive to a voltage at the first input terminal being greater than a voltage at the second input terminal and a low logic level responsive to the voltage at the first input terminal being less than the voltage at the second input terminal.

* * * * *